(12) United States Patent
Kim (10) Patent No.: US 7,263,013 B2
(45) Date of Patent: Aug. 28, 2007

(54) SYNCHRONOUS MEMORY DEVICE CAPABLE OF CONTROLLING WRITE RECOVERY TIME

(75) Inventor: Tae-Yun Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 626 days.

(21) Appl. No.: 10/880,831

(22) Filed: Jun. 29, 2004

(65) Prior Publication Data

US 2005/0097292 A1    May 5, 2005

(30) Foreign Application Priority Data

Oct. 31, 2003    (KR) ...................... 10-2003-0076830

(51) Int. Cl.
*G11C 7/00* (2006.01)
(52) U.S. Cl. ................. 365/203; 365/189.04; 365/191; 365/233
(58) Field of Classification Search ................ 365/203, 365/189.04, 191, 233
See application file for complete search history.

(56) References Cited

U.S. PATENT DOCUMENTS 6,434,082 B1 * 8/2002 Hovis et al. ................ 365/233
7,042,781 B2 * 5/2006 Kim ........................... 365/205

* cited by examiner

*Primary Examiner*—Anh Phung
*Assistant Examiner*—Pho M. Luu
(74) *Attorney, Agent, or Firm*—Blakely Sokoloff Taylor & Zafman (57) ABSTRACT

A memory device for adjusting a write recovery time includes a synchronous write recovery time controlling block which receives a control signal for performing an auto-precharge operation and delays out the control signal as long as a certain clock section of the operational clock corresponding to the write recovery time, an asynchronous write recovery time controlling block for delaying out the control signal coupled thereto as long as a fixed delay time corresponding to the write recovery time, a selecting block for choosing the synchronous write recovery time controlling block or the asynchronous write recovery time controlling block, and an auto-precharge controlling block which outputs as an auto-precharge execution signal used in performing the auto-precharge operation a signal outputted from the synchronous write recovery time controlling block or the asynchronous write recovery time controlling block in response to a write command.

15 Claims, 6 Drawing Sheets

FIG. 6B

SYNCHRONOUS MEMORY DEVICE CAPABLE OF CONTROLLING WRITE RECOVERY TIME

FIELD OF THE INVENTION

The present invention relates to a semiconductor memory device; and, more particularly, to a memory device capable of controlling a write recovery time.

BACKGROUND OF THE INVENTION

A memory device is required to operate in a high speed and there is a 'write recovery time' in a specification representing the performance of the memory device.

The write recovery time tWR presents a time until an auto-precharge operation is performed after data is stored in a unit cell of the memory device. That is, the write recovery time tWR means a minimum time that data is sufficiently stored in an activated bank without being disturbed by an auto-precharge command.

For instance, in a memory device where the write recovery time tWR is synchronously adjusted, when a burst length is set to 2 at a mode register set (MRS) of the memory device and a write operation is performed, the write recovery time tWR becomes a time from a rising edge of a clock where a second data is inputted to a rising edge of a clock where the auto-precharge command is provided. The burst length is the number of data to be sequentially accessed by one command.

When developing the memory device, as methods for adjusting the write recovery time tWR, there are a synchronous method for performing the auto-precharge operation according to a certain number of operational clocks after the write operation is performed and an internal burst length period is passed, an asynchronous method for executing the auto-precharge operation according to a fixed delay time after the write operation is performed and the internal burst length period is passed, and a compounded method adopting both of the synchronous and the asynchronous methods.

One of the above methods is appropriately selected according to the usage and an operational frequency of the memory device, and the variation of PVT (process, voltage, temperature).

In case that there are lots of manufacturing variation at the beginning of developing a memory device, the write recovery time tWR is adjusted by using the synchronous method. On the other hand, when using a wide operational frequency bandwidth, it is preferable to adjust the write recovery time tWR by using the asynchronous method.

Figure 1:
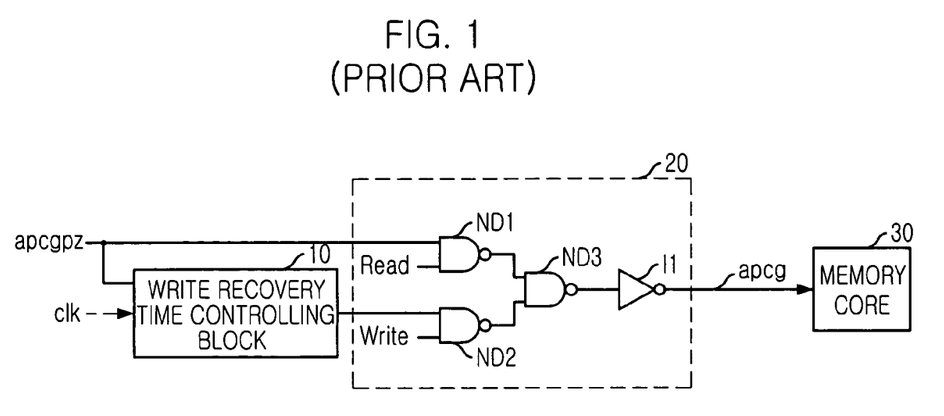
FIG. 1 is a block diagram of a conventional memory device.

FIG. 1 is a block diagram of a conventional memory device.

Referring to FIG. 1, the conventional memory device includes a write recovery time controlling block 10 for receiving an auto-precharge control signal apcgpz and delaying the received signal apcgpz as long as a certain time corresponding to a write recovery time, an auto-precharge operation controlling block 20 which outputs an auto-precharge execution signal apcg after receiving the auto-precharge control signal apcgpz in response to a read signal Read when an operation corresponding to a read command is in progress and outputs the auto-precharge execution signal apcg by receiving the auto-precharge control signal apcgpz in response to a write signal Write when an operation corresponding to a write command is in progress, and a memory core 30 which contains a plurality of unit cells, wherein data stored in a selected unit cell is accessed in response to the read/write command, and performs the auto-precharge operation in response to the auto-precharge execution signal apcg outputted from the auto-precharge operation controlling block 20.

Hereinafter, the operation of the conventional memory device is explained in detail with reference to FIG. 1.

At first, the auto-precharge operation controlling block 20 outputs the auto-precharge execution signal apcg by receiving the auto-precharge control signal apcgpz responding to the read signal Read when the operation corresponding to the read command is in progress. The read signal Read is generated by decoding a command, which is inputted to perform the read operation, at a command decoder (not shown). The auto-precharge control signal apcgpz is internally produced to perform the auto-precharge operation that is executed after the memory device accesses data in response to one command.

Meanwhile, the auto-precharge operation controlling block 20 outputs the auto-precharge execution signal apcg by receiving a signal outputted from the write recovery time controlling block 10 responding to the write signal Write when the operation corresponding to the write command is in progress. Herein, the write signal Write is generated by decoding a command, which is inputted to perform the write operation, at the command decoder.

The write recovery time controlling block 10 delays the auto-precharge control signal apcgpz inputted thereto as long as a certain time and outputs a delayed signal to the auto-precharge operation controlling block 20.

If the auto-precharge execution signal apcg is enabled and provided thereto, the memory core 30 performs the auto-precharge operation in response to the enabled auto-precharge execution signal apcg.

The reason why generating the auto-precharge execution signal apcg by using the signal outputted from the write recovery time controlling block 10 during the write operation is that the write recovery time tWR should be secured during the write operation as afore-mentioned. The write recovery time tWR represents a time until performing the auto-precharge operation after accessing data in response to the write command.

The write recovery time controlling block 10 uses a synchronous method or an asynchronous method so as to receive the auto-precharge control signal apcgpz, delay it and output a delayed signal, to thereby secure the write recovery time tWR.

If the write recovery time controlling block 10 uses the synchronous method, it performs the write operation by receiving a clock signal clk and delays the auto-precharge control signal apcgpz as long as a time corresponding to the fixed number of clocks after a period corresponding to the burst length BL is passed, thereby outputting the delayed precharge control signal.

On the other hand, if the write recovery time controlling block 10 adopts the asynchronous method, it delays the auto-precharge control signal apcgpz as long as a certain time after the period corresponding to the burst length BL is passed, and outputs the delayed precharge control signal.

In general, in the early stage of the development of the memory device, the synchronous method is used because there is the great variation in a manufacturing environment. On the other hand, in case that the variation of the manufacturing environment becomes stable, the asynchronous method is utilized since a frequency of the operational clock can be widely used.

However, in order to design a flexible device having various uses as afore-mentioned, there is a problem of increasing the development time and cost of the device according to the application.

SUMMARY OF THE INVENTION

It is, therefore, an object of the present invention to provide a memory device capable of adjusting a write recovery time by using a synchronous method or an asynchronous method.

In accordance with the present invention, there is provided a synchronous memory device operating synchronized with an operational clock, which includes a synchronous write recovery time controlling block which receives a control signal for performing an auto-precharge operation and delays out the control signal as long as a certain clock section of the operational clock corresponding to a write recovery time, an asynchronous write recovery time controlling block for delaying out the control signal coupled thereto as long as a fixed delay time corresponding to the write recovery time, a selecting block for choosing the synchronous write recovery time controlling block or the asynchronous write recovery time controlling block, and an auto-precharge controlling block which outputs as an auto-precharge execution signal used in performing the auto-precharge operation a signal outputted from the synchronous write recovery time controlling block or the asynchronous write recovery time controlling block in response to a write command.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In the following detailed description, the preferred embodiments of the present invention are set forth in order to provide a thorough understanding of the invention with reference to the drawings. However, it will be understood by those skilled in the art that the present invention may be practiced without these preferred embodiments.

Figure 2:
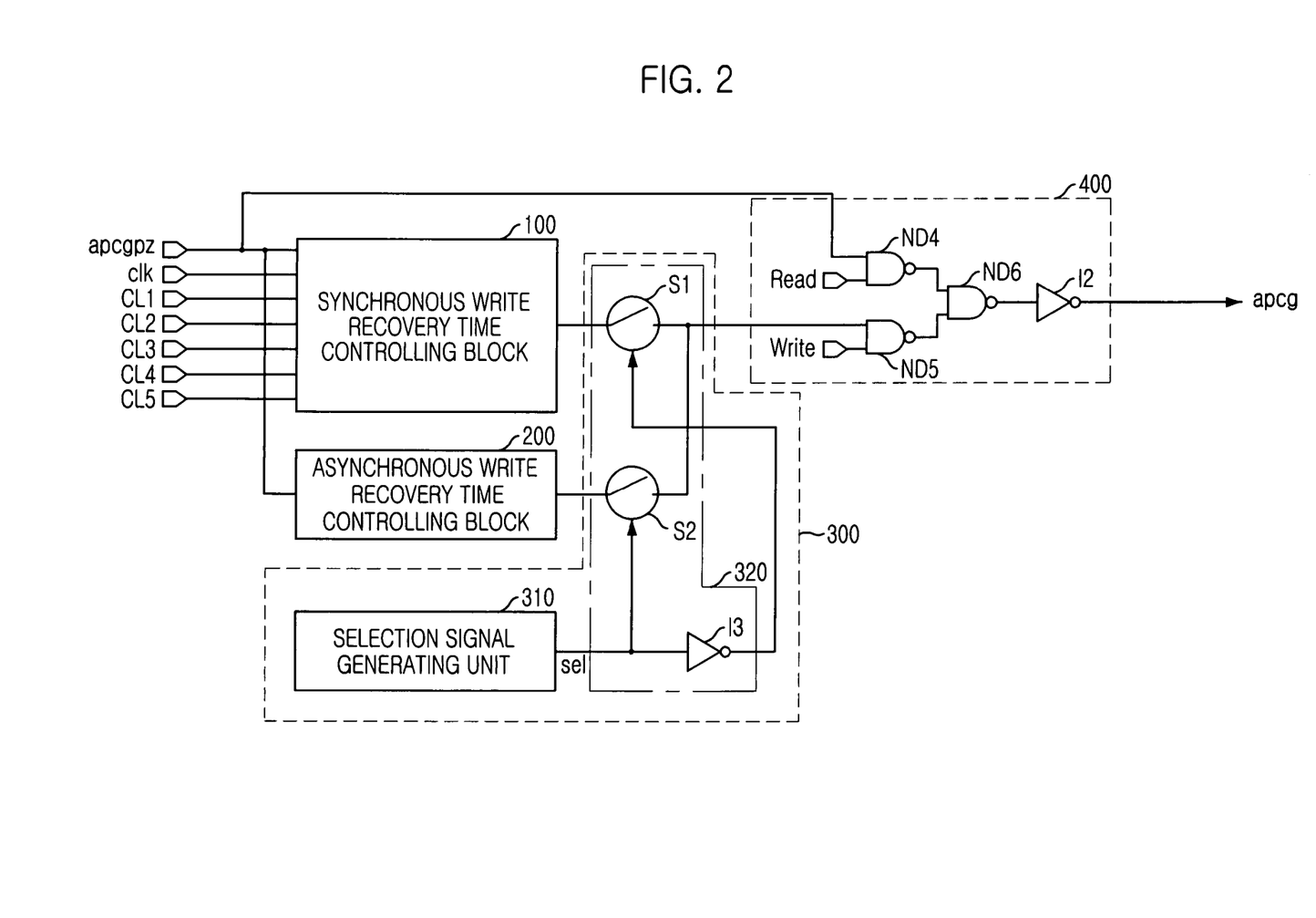
FIG. 2 provides a block diagram of a memory device in accordance with the preferred embodiment of the present invention.

FIG. 2 shows a block diagram of a memory device in accordance with the preferred embodiment of the present invention.

Referring to FIG. 2, the invention memory device includes a synchronous write recovery time controlling block 100 for receiving a control signal apcgpz so as to perform an auto-precharge operation and delaying the control signal apcgpz as long as a certain clock section of an operational clock clk corresponding to a write recovery time tWR, an asynchronous write recovery time controlling block 200 for delaying the control signal apcgpz as long as a fixed delay time corresponding to the write recovery time tWR, a selection block 300 for choosing the synchronous write recovery time controlling block 100 or the asynchronous write recovery time controlling block 200, and an auto-precharge controlling block 400 for outputting a signal outputted from the synchronous write recovery time controlling block 100 or the asynchronous write recovery time controlling block 200 based on a write signal Write generated in response to a write command as an auto-precharge execution signal apcg for performing the auto-precharge operation.

The synchronous write recovery time controlling block 100 also adjusts the certain clock section for delaying the control signal apcgpz according to a CAS latency mode selected from a plurality of CAS latency modes, e.g., CL1 to CL5.

The auto-precharge controlling block 400 outputs the control signal apcgpz in response to a read signal Read generated according to a read command as the auto-precharge execution signal apcg for performing the auto-precharge operation.

The selection block 300 contains a selection signal generating unit 310 which has a fuse and outputs a selection signal sel to choose the synchronous write recovery time controlling block 100 or the asynchronous write recovery time controlling block 200 according to whether the fuse is blown or not, and a switching unit 320 for transferring the output signal from the synchronous write recovery time controlling block 100 or the asynchronous write recovery time controlling block 200 in response to the selection signal sel to the auto-precharge controlling block 400.

The switching unit 320 has a first switch S1 which is turned on at a first level of the selection signal sel to thereby transfer the output signal of the synchronous write recovery time controlling block 100 to the auto-precharge controlling block 400 and a second switch S2 which is turned on at a second level of the selection signal sel to thereby deliver the output signal of the asynchronous write recovery time controlling block 200 to the auto-precharge controlling block 400.

The auto-precharge controlling block 400 contains a NAND gate ND4 for receiving the read signal Read and the control signal apcgpz, a NAND gate ND5 for receiving the write signal Write and the output signal from the synchronous write recovery time controlling block 100 or the asynchronous write recovery time controlling block 200, a NAND gate ND6 coupled with outputs of the NAND gates ND4 and ND5, and an inverter I2 for inverting an output of the NAND gate ND6 and outputting the inverted signal as the auto-precharge execution signal apcg.

Figure 3:
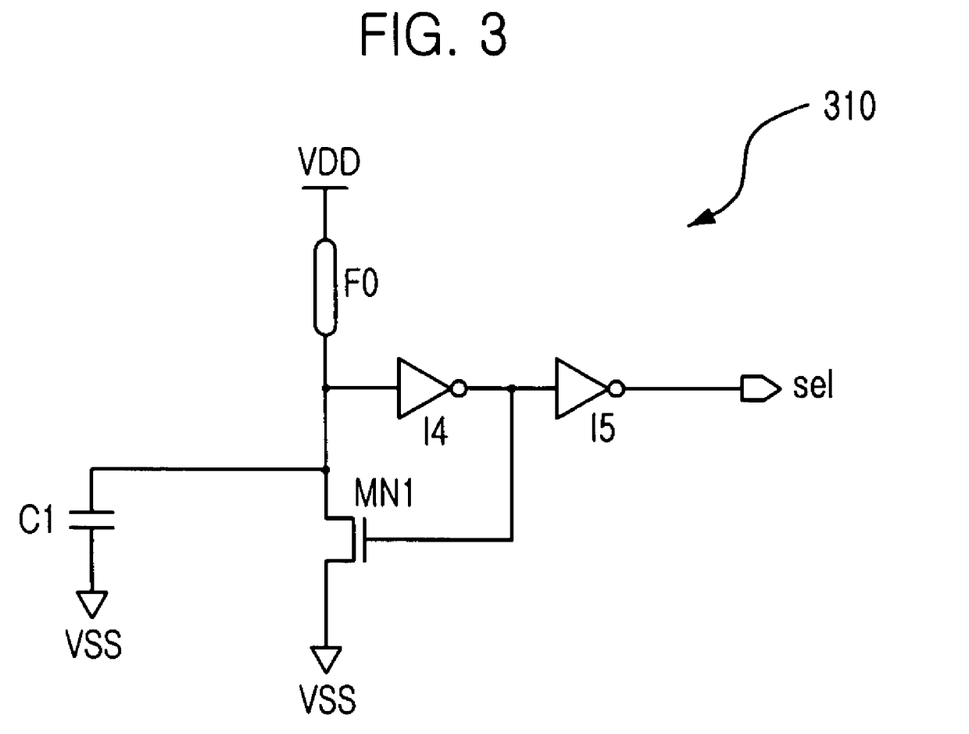
FIG. 3 describes a circuit diagram of a selection signal generating unit in FIG. 2.

FIG. 3 describes a circuit diagram of the selection signal generating unit 310 in FIG. 2.

Referring to FIG. 3, the selection signal generating unit 310 contains a fuse F0 whose one end is connected to a supply voltage node VDD, an inverter I4 whose input node is attached to the other end of the fuse F0, a MOS transistor MN1 whose gate is connected to an output node of the inverter I4 and which is attached between the other end of the fuse F0 and a ground voltage node VSS, a capacitor C1 connected between the other end of the fuse F0 and the ground voltage node VSS, and an inverter I5 for outputting the selection signal sel by inverting an output of the inverter I4, wherein the selection signal sel is used to choose the synchronous write recovery time controlling block 100 or the asynchronous write recovery time controlling block 200.

Figure 4:
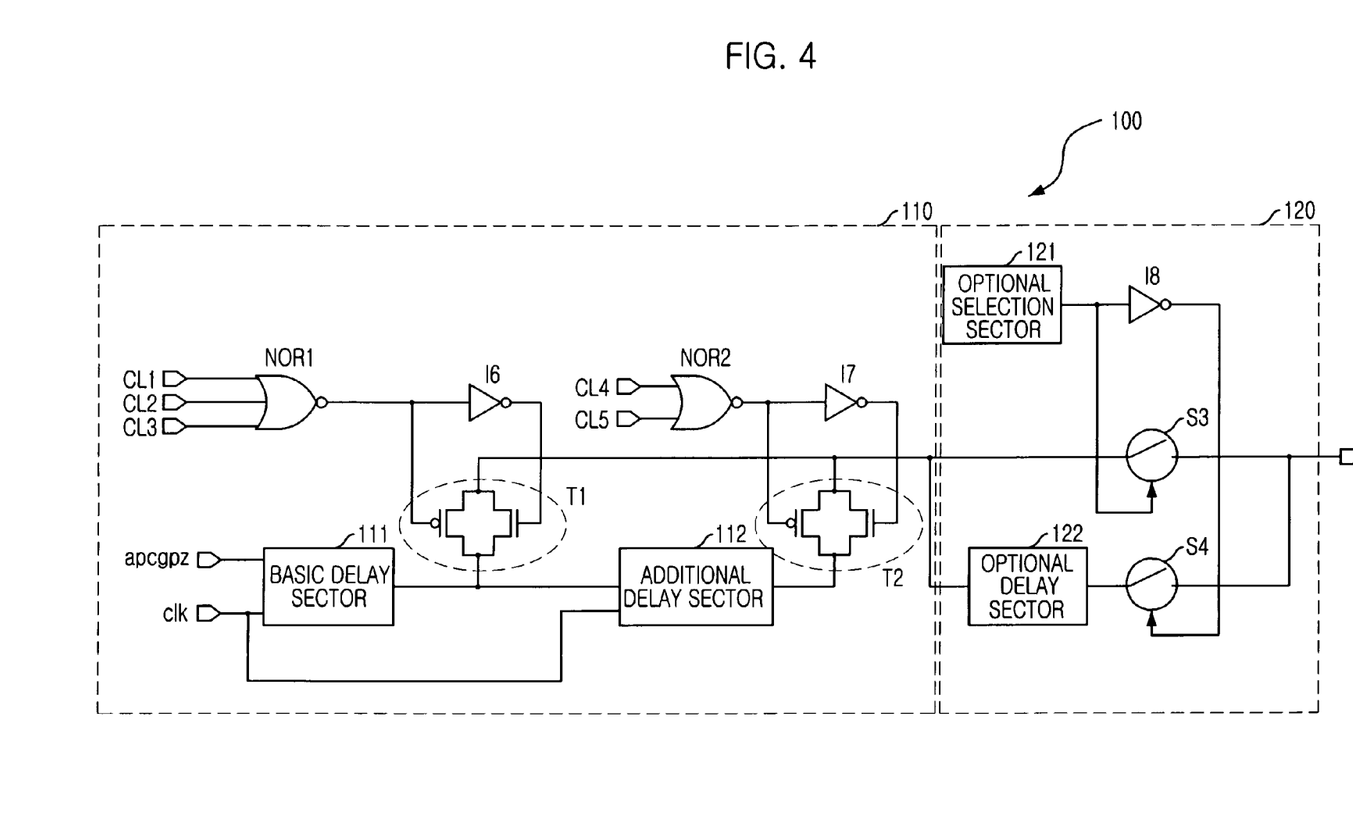
FIG. 4 represents a circuit diagram of a synchronous write recovery time controlling block in FIG. 2.

FIG. 4 represents a circuit diagram of the synchronous write recovery time controlling block 100 in FIG. 2.

Referring to FIG. 4, the synchronous write recovery time controlling block 100 contains a synchronous delay unit 110, which has a multiplicity of delay sectors, e.g., 111 and 112, operating synchronized with the operational clock clk, for outputting the control signal apcgpz to the auto-precharge controlling block 400 via delay sectors whose number corresponds to the CAS latency modes, and an optional unit 120 for delivering an output of the synchronous delay unit 110 after delaying it as long as a certain time or directly transferring it to the auto-precharge controlling block 400 without any delay.

The synchronous delay unit 110 has a basic delay sector 111 for delaying the control signal apcgpz as many as a first fixed clock number of the operational clock clk, e.g. 0.5 or 1.5 clocks, and outputting a delayed control signal, a first transmission gate T1 that is turned on in response to a first CAS latency mode CL1 to CL3 among a plurality of CAS latency modes CL1 to CL5 to thereby transfer an output of the basic delay sector 111 to the optional unit 120, an additional delay sector 112 for delaying the output of the basic delay sector 111 as many as a second fixed clock number of the operational clock clk and outputting a delayed signal, and a second transmission gate T2 that is turned on in response to a second CAS latency mode CL4 and CL5 among the plurality of CAS latency modes CL1 to CL5 to thereby transfer an output of the additional delay sector 112 to the optional unit 120.

The optional unit 120 has an optional delay sector 122 for delaying an output signal of the delay unit 110, a switch S3 for selectively transferring the output of the delay unit 110 to the auto-precharge controlling block 400, a switch S4 for selectively delivering an output of the optional delay sector 122 to the auto-precharge controlling block 400, and an optional selection sector 121 for controlling the switch S3 and the switch S4 to be selectively turned-on.

The optional selection sector 121 has a fuse, and the switch S3 or the switch S4 is selectively turned-on according to whether the fuse is blown or not. The optional selection sector 121 can be constructed like the selection signal generating unit 310 described in FIG. 3.

Herein, the CAS latency modes are classified into CL1 to CL3, and CL4 and CL5 and they can be divided differently according to a memory device. Further, the number of delay sectors employed therein is also adjustable.

Figure 5:
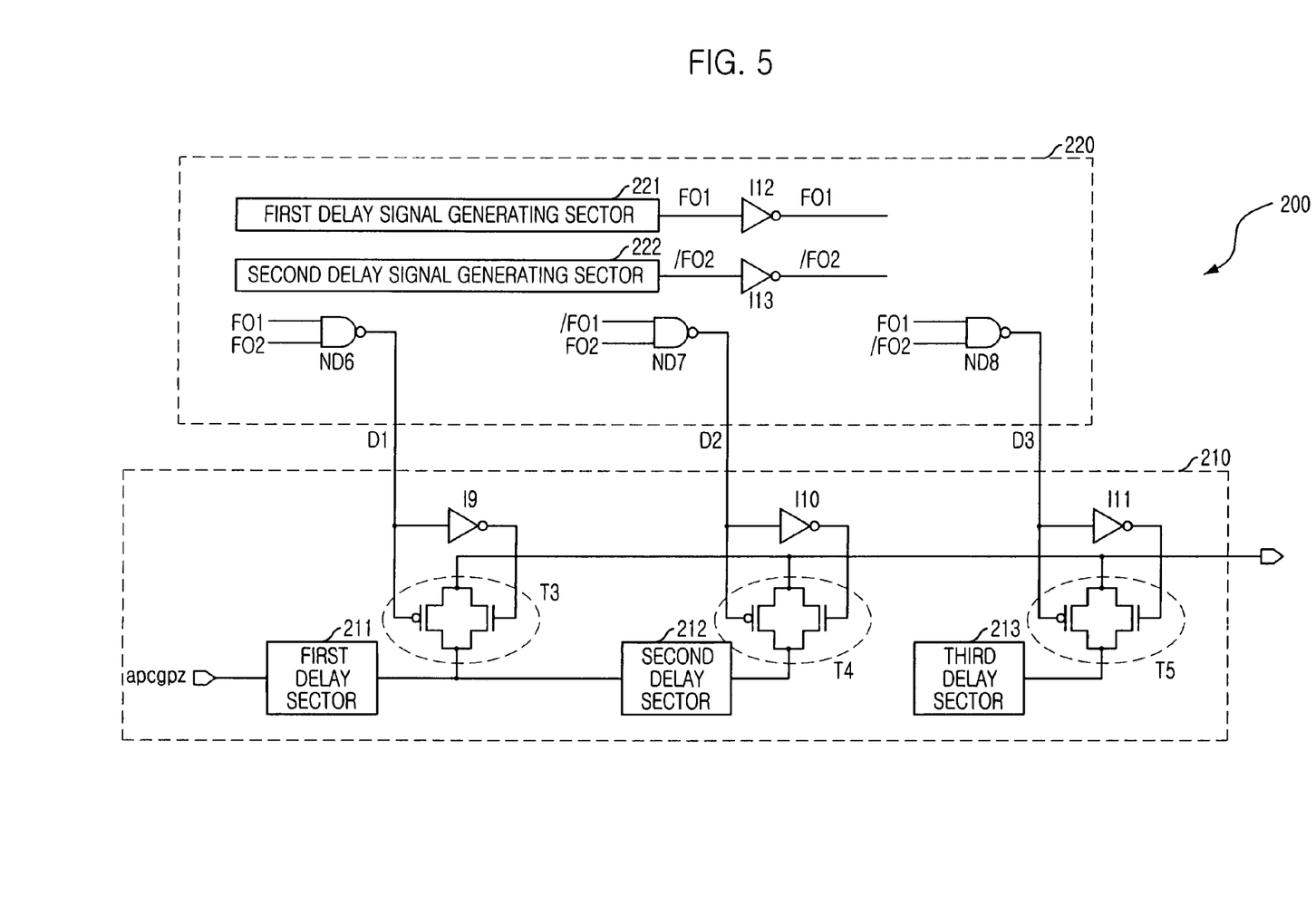
FIG. 5 shows a circuit diagram of an asynchronous write recovery time controlling block in FIG. 2.

FIG. 5 shows a circuit diagram of the asynchronous write recovery time controlling block 200 in FIG. 2.

Referring to FIG. 5, the asynchronous write recovery time controlling block 200 includes a delay adjusting unit 220 for outputting coded delay control signals D1, D2 and D3 corresponding to a delay time intended at the asynchronous write recovery time controlling block 200, and an asynchronous delay unit 210 which has a plurality of delay sectors, e.g., 211, 212 and 213, for delaying signals as much as a corresponding unit time and passes the control signal apcgpz for performing the auto-precharge operation through the delay sectors whose number corresponds to the number of the coded delay control signals outputted from the delay adjusting unit 220 and outputting the delayed control signal to the auto-precharge controlling block 400. For instance, if the coded delay control signal D2 is actuated, the asynchronous write recovery time controlling block 200 passes out the control signal apcgpz through the delay sectors 211 and 212.

The asynchronous delay unit 210 contains the first delay sector 211 for delaying the control signal apcgpz, a transmission gate T3 for delivering an output signal of the first delay sector 211, a second delay sector 212 for delaying the output signal of the first delay sector 211, a transmission gate T4 for transferring an output signal of the second delay sector 212, a third delay sector 213 for delaying the output signal of the second delay sector 212, and a transmission gate T5 for delivering an output signal of the third delay sector 213. Herein, the transmission gates T3, T4 and T5 are selectively turned on in response to the coded delay control signals D1, D2 and D3.

Figure 6A:
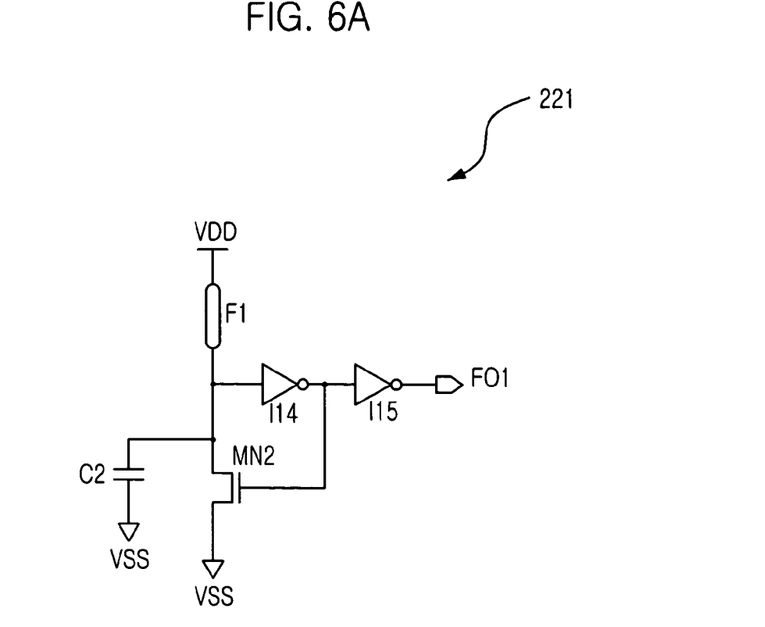
FIG. 6A depicts a circuit diagram of a first delay signal generating sector in FIG. 5.
Figure 6B:
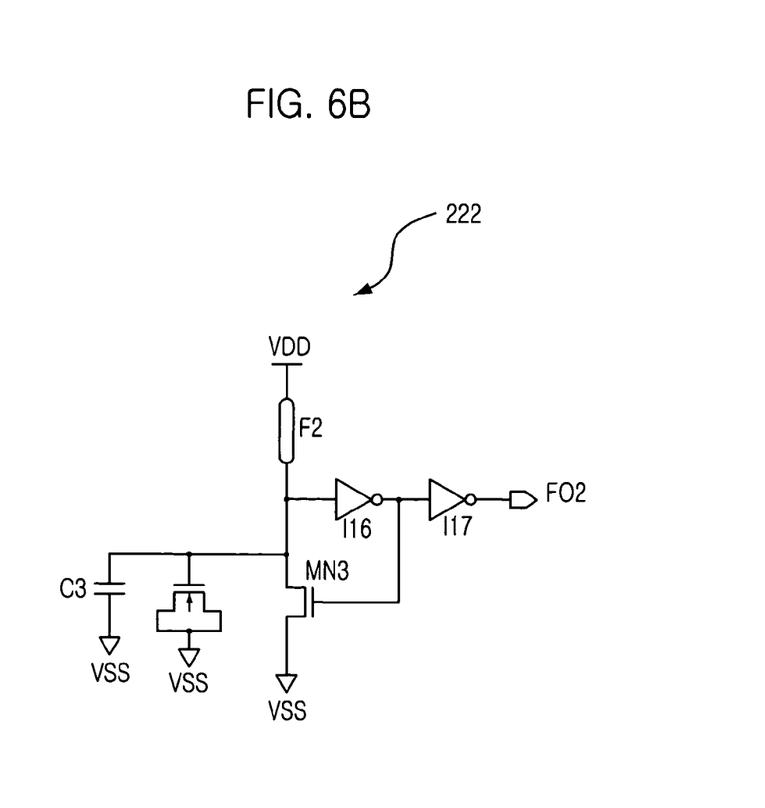
FIG. 6B depicts a circuit diagram of a second delay signal generating sector in FIG. 5.

The delay adjusting unit 220 has a first delay signal generating sector 221 which employs a first fuse (not shown, refer to FIG. 6) and generates a first encoding signal FO1 according to whether the first fuse is blown or not, a second delay signal generating sector 222 which employs a second fuse (not shown, refer to FIG. 6) and produces a second encoding signal FO2 according to whether the second fuse is blown or not, and a delay signal decoder for decoding the first and the second encoding signals FO1 and FO2 and generating the coded delay control signals D1, D2 and D3 in order to selectively turn on the transmission gates T3 to T5.

The delay signal decoder has an inverter I12 for inverting the first encoding signal FO1, an inverter I13 for inverting the second encoding signal FO2, a NAND gate ND6 for producing the coded delay control signal D1 so as to turn on the transmission gate T3 based on the first and the second encoding signals FO1 and FO2, a NAND gate ND7 for generating the coded delay control signal D2 so as to turn on the transmission gate T4 based on an inverted first encoding signal /FO1 outputted from the inverter I12 and the second encoding signal FO2, and a NAND gate ND8 for producing the coded delay control signal D3 so as to turn on the transmission gate T5 based on the first encoding signals FO1 and an inverted second encoding signal /FO2 outputted from the inverter I13.

FIGS. 6A and 6B provide circuit diagrams of the first and the second delay signal generating sectors 221 and 222 described in FIG. 5.

Referring to FIG. 6A, the first delay signal generating sector 221 contains a first fuse F1 whose one end is attached to a supply voltage node VDD, a first inverter I14 whose input node is connected to the other end of the first fuse F1, a MOS transistor MN2 whose gate is coupled with an output node of the inverter I14 and which is connected between the other end of the first fuse F1 and a ground voltage node VSS, a capacitor C2 attached between the other end of the first fuse F1 and the ground voltage node VSS, and a second inverter I15 for inverting an output of the first inverter I14 and outputting its inverted signal as the first encoding signal FO1.

Since the structure of the second delay signal generating sector 222 is almost same as that of the first delay signal generating sector 221, there is omitted a detailed explanation about it.

Hereinafter, an operation of the preferred embedment of the present invention will be explained with reference to FIGS. 2 to 6.

At first, if the read signal Read generated in response to the read command is actuated and inputted thereto, the auto-precharge controlling block 400 receives the auto-precharge control signal apcgpz and generates the auto-precharge execution signal apcg.

At this time, the memory device performs a precharge operation corresponding to the read operation in response to the auto-precharge execution signal apcg.

Then, if the read signal Read generated in response to the read command is actuated and inputted thereto, the auto-precharge controlling block 400 produces the auto-precharge execution signal apcg based on a signal provided from the synchronous write recovery time controlling block 100 or the asynchronous write recovery time controlling block 200.

The selection block 300 chooses whether the signal inputted to the auto-precharge controlling block 400 is provided from the synchronous write recovery time controlling block 100 or the asynchronous write recovery time controlling block 200.

If the switch Si of the switching unit 320 in the selection block 300 is turned on, the output of the synchronous write recovery time controlling block 100 is transmitted to the auto-precharge controlling block 400. On the other hand, if the switch S2 of the switching unit 320 is turned on, the output of the asynchronous write recovery time controlling block 200 is coupled to the auto-precharge controlling block 400.

A level of the output signal sel of the selection signal generating unit 310 is determined according to whether the fuse F0 is blown or not. As a result, one of the switches Sl and S2 is turned on.

In the synchronous write recovery time controlling block 100, the synchronous delay unit for passing the auto-precharge control signal apcgpz is decided according to a set CAS latency mode.

Each of the basic delay sector 111, the additional delay sector 112 and the optional delay sector 122 delays a corresponding input signal as long as a corresponding fixed clock period synchronized with the operational clock clk.

For example, if a currently set CAS mode is CL=3, the transmission gate T2 is turned on and the transmission gate T1 is turned off. As a result, the auto-precharge control signal apcgpz is delayed as long as the clock period fixed by the basic delay sector 111 and the additional delay sector 112 and provided to the optional block 120. Herein, the CAS latency mode is classified into CL=1,2,3 and CL=4,5. However, the classification scheme can be changed according to features of a memory device and, at this case, in accordance with another embodiment of the present invention, the memory device can employ more delay sectors than in the preferred embodiment.

The optional block 120 is used to extend the delay time of the signal outputted from the delay block 110. The extension of the delay time is determined by a selected one of the switches S3 and S4 employed in the option block 120.

The optional selection sector 121 for turning on the switch S3 or S4 can be constructed in the same form as the selection signal generating unit 310 in FIG. 3.

Meanwhile, the asynchronous write recovery time controlling block 200 passes out the auto-precharge control signal apcgpz to the delay sector selected from the plurality of delay sectors 211, 212 and 213 employed in the asynchronous delay unit 210 in response to the signal outputted from the delay signal adjusting unit 220.

For instance, if the first and the second delay signal generating sectors 221 and 222 output high level signals, the delay signal decoder decodes the high level signals and outputs the signal D1 for turning on the transmission gate T3. If the transmission gate T3 is turned on, the rest of the transmission gates T4 and T5 are turned off and the auto-precharge control signal apcgpz is passed through only the first delay sector 211 and outputted to the auth-precharge controlling block 400.

As shown in FIG. 6, the first and the second delay signal generating sectors 221 and 222 employ the fuses F1 and F2, respectively, and output the encoding signals FO1 and FO2, respectively, according to whether the fuses F1 and F2 are blown or not.

As afore-mentioned, in accordance with the present invention, the memory device can adopt the synchronous method or the asynchronous method to adjust the timing for executing the auto-precharge operation corresponding to the write operation. The adjusting of the timing for executing the auto-precharge operation means the adjusting of the write recovery time as described above.

Therefore, the inventive memory device adjusts a write recovery time asynchronously or synchronously according to a required condition such as an operational frequency and the usage of a memory device. The inventive memory device uses the synchronous method in the early stage of the development of the device where there are lots of manufacturing variation and the asynchronous method in a condition requiring a wide operational frequency bandwidth.

That is, in accordance with the present invention, since it is possible to flexibly adjust the write recovery time, there is no need to change a design of the memory device according to the method for adjusting the write recovery time. As a result, it is expected that the development time and cost of the memory device is decreased.

The present application contains subject matter related to Korean patent application No. 2003-76830, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A synchronous memory device operating synchronized with an operational clock, which comprises:
   a synchronous write recovery time controlling means which receives a control signal for performing an auto-precharge operation and delays out the control signal as long as a certain clock section of the operational clock corresponding to a write recovery time;
   an asynchronous write recovery time controlling means for delaying out the control signal coupled thereto as long as a fixed delay time corresponding to the write recovery time;
   a selecting means for choosing the synchronous write recovery time controlling means or the asynchronous write recovery time controlling means; and
   an auto-precharge controlling means which outputs as an auto-precharge execution signal used in performing the auto-precharge operation a signal outputted from the synchronous write recovery time controlling means or the asynchronous write recovery time controlling means in response to a write command.

2. The synchronous memory device as recited in claim 1, wherein the synchronous write recovery time controlling means adjusts the certain clock section in response to a set CAS latency mode.

3. The synchronous memory device as recited in claim 2, wherein the synchronous write recovery time controlling means includes:

a synchronous delay unit which employs a plurality of delay sectors operating synchronized with the operational clock and passes the control signal through delay sectors whose number corresponds to the CAS latency mode to the auto-precharge controlling means; and an optional unit for delaying out an output of said delay unit as long as a certain time or delivering said output without any delay to the auto-precharge controlling means.

4. The synchronous memory device as recited in claim 3, wherein the synchronous delay unit contains:

a basic delay sector for delaying out the control signal as many as a first fixed clock number of the operational clock;

a first transmission gate that is turned on corresponding to a first CAS latency mode having a low clock number among a multiplicity of CAS latency modes to thereby deliver an output of the basic delay sector to the optional unit;

an additional delay sector for delaying out the output of the basic delay sector as many as a second fixed clock number of the operational clock; and a second transmission gate that is turned on corresponding to a second CAS latency mode of the multiplicity of CAS latency modes to thereby transfer an output of the additional delay sector to the optional unit.

5. The synchronous memory device as recited in claim 4, wherein the optional unit contains:

an optional delay sector for delaying out the output signal of the synchronous delay unit as long as a fixed time;

a first switch for selectively delivering the output signal of the synchronous delay unit to the auto-precharge controlling means;

a second switch for selectively transferring an output of the optional delay sector to the auto-precharge controlling unit; and an optional selection sector for controlling the first switch or the second switch to be selectively turned on.

6. The synchronous memory device as recited in claim 5, wherein the optional selection sector employs a fuse and selectively enables the first switch or the second switch according to whether said fuse is blown or not.

7. The synchronous memory device as recited in claim 1, wherein the auto-precharge controlling means outputs the control signal for performing the auto-precharge operation as the auto-precharge execution signal in response to a read command.

8. The synchronous memory device as recited in claim 1, wherein the selecting means includes:

a selection signal generating unit which contains a fuse and produces a selection signal for choosing the synchronous write recovery time controlling means or the asynchronous write recovery time controlling means according to whether the fuse is blown or not; and a switching unit for transferring the signal outputted from the synchronous write recovery time controlling means or the asynchronous write recovery time controlling means to the auto-precharge controlling means in response to the selection signal.

9. The synchronous memory device as recited in claim 8, wherein the switching unit contains:

a first switch, turned on at a first level of the selection signal, for transferring the signal outputted from the synchronous write recovery time controlling means to the auto-precharge controlling means; and a second switch, turned on at a second level of the selection signal, for delivering the signal outputted from the asynchronous write recovery time controlling means to the auto-precharge controlling means.

10. The synchronous memory device as recited in claim 8, wherein the selection signal generating unit contains:

a fuse whose one end is connected to a supply voltage node;

a first inverter whose input node is attached to the other end of said fuse;

a MOS transistor whose gate is coupled with an output node of the first inverter and which is connected between the other end of said fuse and a ground voltage node;

a capacitor attached between the other end of said fuse and the ground voltage node; and a second inverter for inverting an output signal of the first inverter and outputting an inverted signal as the selection signal for choosing the synchronous write recovery time controlling means or the asynchronous write recovery time controlling means.

11. The synchronous memory device as recited in claim 1, wherein the asynchronous write recovery time controlling means includes:

a delay adjusting unit for outputting coded delay control signals corresponding to a delay time decided at the asynchronous write recovery time controlling unit; and an asynchronous delay unit which employs a plurality of delay sectors and passes the control signal to the auto-precharge controlling means through the delay sectors whose number corresponds to the number of the coded delay control signals outputted from the delay adjusting unit.

12. The synchronous memory device as recited in claim 11, wherein the asynchronous delay unit contains:

a first delay sector for delaying out the control signal;

a first transmission gate for delivering an output of the first delay sector;

a second delay sector for delaying out the output of the first delay sector;

a second transmission gate for transferring an output of the second delay sector;

a third delay sector for delaying out the output of the second delay sector; and a third transmission gate for delaying out an output of the third delay sector, wherein the first to the third transmission gates are selectively turned on in response to the coded delay control signals provided from the delay adjusting unit.

13. The synchronous memory device as recited in claim 12, wherein the delay adjusting unit contains:

a first delay signal generating sector which employs a first fuse and produces a first encoding signal according to whether the first fuse is blown or not;

a second delay signal generating sector which employs a second fuse and generates a second encoding signal according to whether the second fuse is blown or not; and a delay signal decoder for decoding the first and the second encoding signals to thereby output the coded delay control signals for turning on one of the first to the third transmission gates in the asynchronous delay unit.

14. The synchronous memory device as recited in claim 13, wherein the first delay signal generating sector employs:

the first fuse whose one end is connected to a supply voltage node;

a first inverter whose input node is attached to the other end of the first fuse;

a MOS transistor whose gate is coupled with an output node of the first inverter and which is connected between the other end of the first fuse and a ground voltage node;

a capacitor attached between the other end of the first fuse and the ground voltage node; and a second inverter for inverting an output signal of the first inverter to thereby output the first encoding signal.

15. The synchronous memory device as recited in claim 13, wherein the delay signal decoder employs:

a first inverter for inverting the first encoding signal;

a second inverter for inverting the second encoding signal;

a first NAND gate for receiving the first and the second encoding signals and outputting a first encoded delay control signal for turning on the first transmission gate;

a second NAND gate for receiving an output signal of said first inverter and the second encoding signal and outputting a second encoded delay control signal for turning on the second transmission gate; and a third NAND gate for receiving the first encoding signal and an output signal of said second inverter and outputting a third encoded delay control signal for turning on the third transmission gate.

* * * * *